(12) United States Patent
Watson

(10) Patent No.: US 6,445,322 B2
(45) Date of Patent: *Sep. 3, 2002

(54) DIGITAL-TO-ANALOG CONVERTER WITH IMPROVED OUTPUT IMPEDANCE SWITCH

(75) Inventor: Minh Watson, Fremont, CA (US)

(73) Assignee: ATI International SRL (BB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/164,948

(22) Filed: Oct. 1, 1998

(51) Int. Cl.$^7$ ................................................ H03M 1/66
(52) U.S. Cl. ........................ 341/144; 341/136; 341/135
(58) Field of Search ................... 341/136, 135, 341/144; 327/53, 52, 65

(56) References Cited

U.S. PATENT DOCUMENTS

| | | | | |
|---|---|---|---|---|
| 5,148,165 A | * | 9/1992 | Phillips | 341/136 |
| 5,406,285 A | | 4/1995 | Diffenderfer et al. | 341/114 |
| 5,410,273 A | * | 4/1995 | Brehmer et al. | 330/253 |
| 5,442,318 A | * | 8/1995 | Badyal et al. | 330/253 |
| 5,541,598 A | | 7/1996 | Malek-Khosravi | 341/118 |
| 5,748,040 A | * | 5/1998 | Leung | 330/253 |
| 5,789,981 A | * | 8/1998 | Singer et al. | 330/253 |
| 5,909,187 A | * | 6/1999 | Ahuja | 341/136 |

* cited by examiner

*Primary Examiner*—Peguy JeanPierre
(74) *Attorney, Agent, or Firm*—Vedder, Price Kaufman & Kammholz

(57) ABSTRACT

A digital-to-analog converter includes a number of current steering cells. In each current steering cell, a current source is biased by a differential amplifier to provide a high output impedance. The high output impedance in the current steering cell allows the digital-to-analog converter to operate under low supply voltage conditions.

7 Claims, 3 Drawing Sheets

DIGITAL-TO-ANALOG CONVERTER WITH IMPROVED OUTPUT IMPEDANCE SWITCH

BACKGROUND OF THE INVENTION

1. Field of the Invention

The present invention relates to integrated circuits. In particular, the present invention relates to integrated circuits which convert a digital signal to an analog signal.

2. Discussion of the Related Art

Digital-to-analog conversion using current steering cells are disclosed, for example, in U.S. Pat. Nos. 5,406,285 and 5,541,598. For such current cells to operate properly, the output impedance of such current cells must remain high, even under low operating voltage conditions.

SUMMARY OF THE INVENTION

In accordance with one aspect of the present invention, a digital-to-analog converter is formed by a number of current steering cells, each biased to steer, in accordance with an input bit, a current of a current source of a predetermined magnitude into an output terminal. In one embodiment of the current invention, the current source is provided which includes (a) a first transistor having a control terminal coupled to receive a first bias voltage, and an input terminal being coupled to receive a reference voltage; (b) a second transistor having an input terminal coupled to the output terminal of the first transistor; and (c) a differential amplifier having one of its differential input terminals coupled to the output terminal of the first transistor, the other one of its input terminals coupled to receive a second bias voltage, and its output terminal coupled to the control terminal of the second transistor. Such a current source has very high output impedance, since the output impedance of the second transistor (a cascode transistor) is amplified by the high gain of the differential amplifier. Further, the second transistor is allowed to operate in a linear region to provide a wide operating range. Because of the high output impedance of this current source, a high noise immunity is achieved with respect to noise in the output terminal of the current source.

The present invention is better understood upon consideration of the detailed description below and the accompanying drawings.

BRIEF DESCRIPTION OF THE DRAWINGS

FIG. 1b shows an improved current cell 150 suitable for use to implement any of current cells 101-1 to 101-n of FIG. 1a.

DETAILED DESCRIPTION OF THE PREFERRED EMBODIMENTS

Figure 1A:
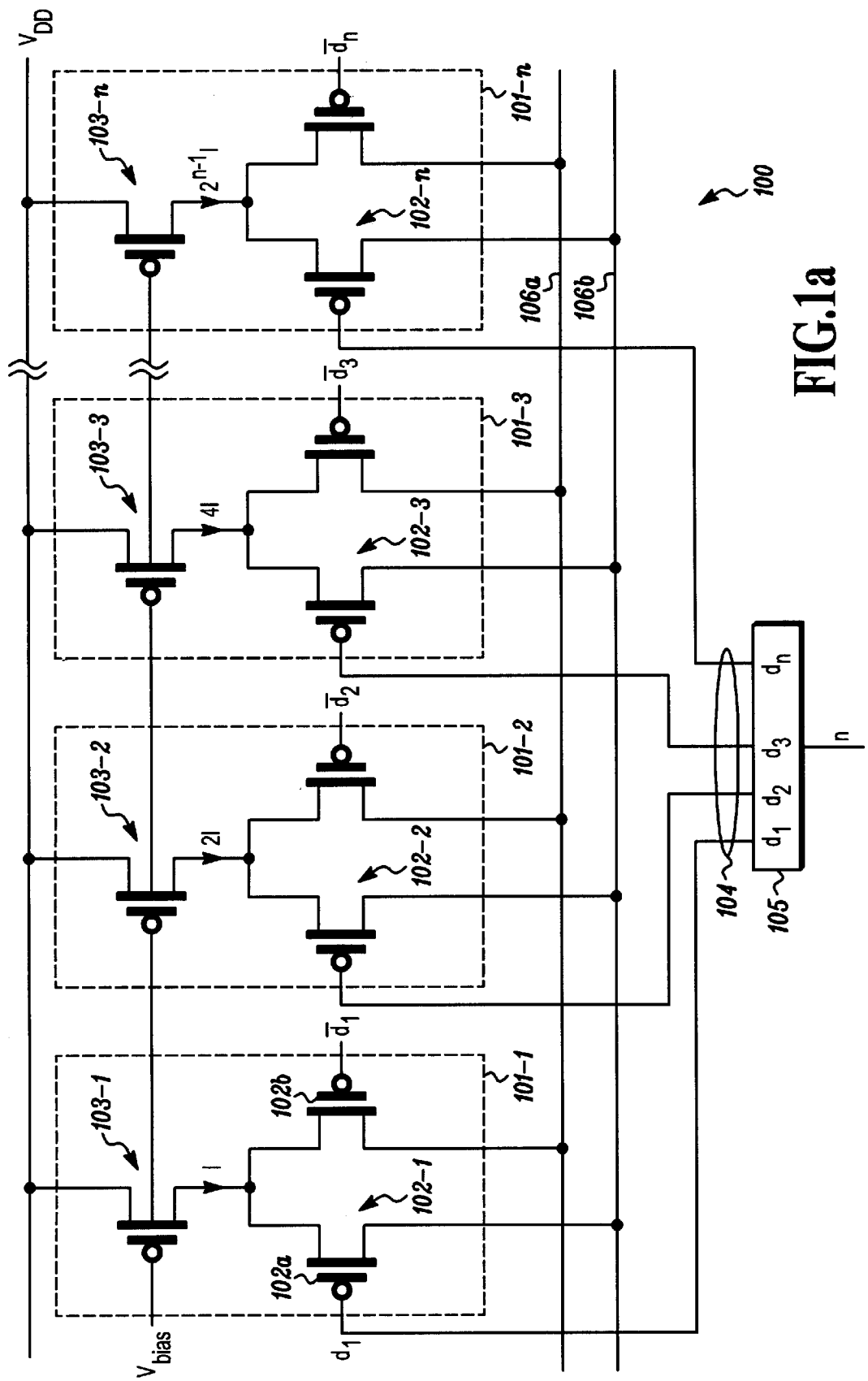
FIG. 1a shows a digital-to-analog converter 100 including a number of current steering cells 101-1 to 101-n, providing an output current proportional to a digital value stored in latch 102.

FIG. 1a shows a digital-to-analog (D/A) converter 100 including a number of current steering cells 101-1 to 101-n. Each of current steering cells 101-1 to 101-n includes a current source (i.e., one of current sources 103-1 to 103-n, each implemented in this instance by a suitably biased PMOS transistor) and a differential input stage (i.e., one of differential input stages 102-1 to 102-n) consisting of PMOS transistors 102a and 102b. Current sources 103-1 to 103-n, shown here each being implemented by a PMOS transistor, are designed to provide current magnitudes $I, 2*I, \ldots, 2^{n-1}*I$, respectively, under a predetermined bias voltage $V_{bias}$ designed to operate the PMOS transistors in the saturation operating region. A latch 105 receives an n-bit digital value and provides the n-bit digital value as output bits 104 ($d_1 d_2 \ldots d_n$). Each of output bits 104 is then used to control a corresponding one of differential input stages 102-1 to 102-n. For each bit of $d_1 d_2 \ldots d_n$ having logic value 1, the corresponding one of current steering cells 101-1 to 101-n provide a load across output terminals 106a and 106b the current of the corresponding one of current sources 103-1 to 103-n. Thus, the current at a load across output terminals 106-a and 106-b is given by:

$$I_{load} = d_1*I + d_2*2I + \ldots + d_n*2^{n-1}I$$

D/A converter 100 suffers the drawback of a low output impedance. Under low operating voltage conditions, the low output impedance may take the PMOS transistors of current sources 103-1 to 103-n out of the deep saturation operating region, thereby causing D/A converter 100 to malfunction.

Figure 1B:
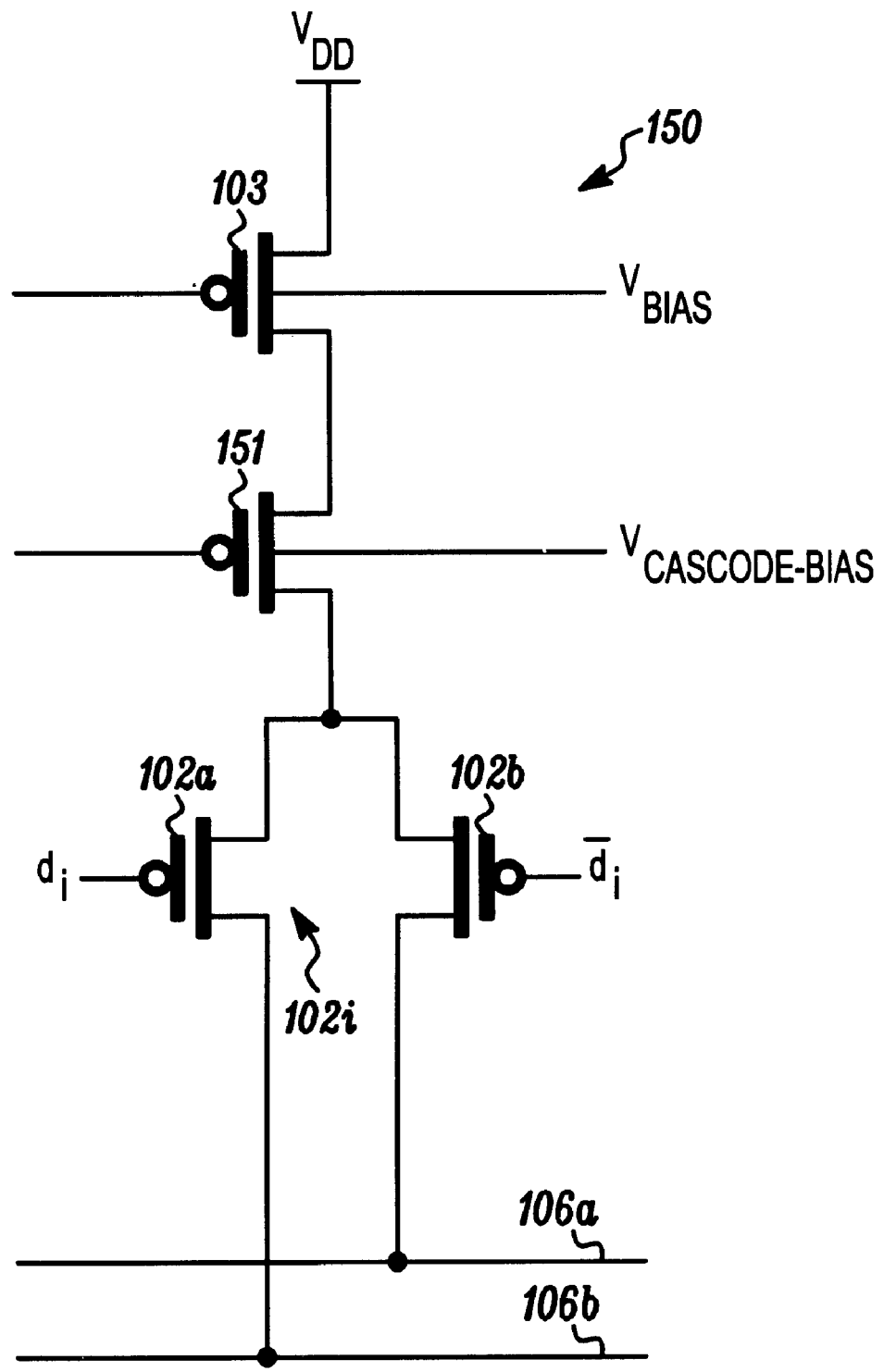

The operating supply voltage range of D/A converter 100 can be extended by increasing the output impedance of current steering cells 101-1 to 101-n. An increased output impedance can be achieved by implementing each of current steering cells 101-1 to 101-n by a current steering cell 150 shown in FIG. 1b. To facilitate comparison between FIGS. 1a and 1b, like elements are provided like reference numerals. As shown in FIG. 1b, a cascode PMOS transistor 151, biased at voltage Vcascode-bias designed to maintain PMOS transistor 151 at the saturation operating region, is inserted in series with PMOS transistor 103. Consequently, the output impedance is increased substantially due to the transconductance $G_{151}$ of PMOS transistor 151. The output impedance $Z_{out}$ of each of current steering cells 101-1 to 101-n is given by:

$$Z_{out} = Z_{103} + Z_{151}(1 + Z_{102}G_{151})$$

where $Z_{103}$, $Z_{102}$, and $Z_{151}$ are impedances of PMOS transistors 103, 102 and 151 respectively.

Figure 2:
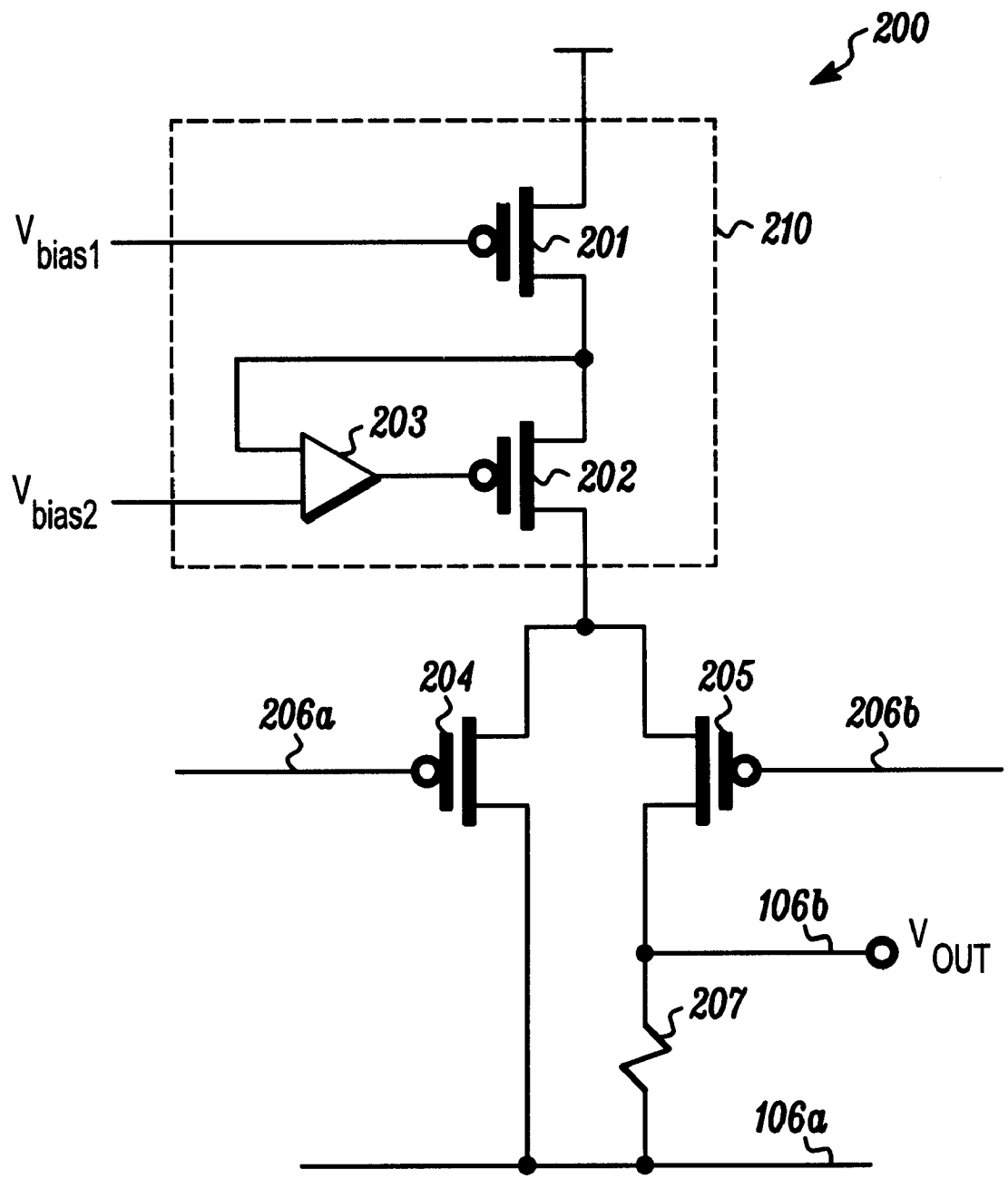
FIG. 2 shows an improved current source with high output impedance provided in an input stage 200, in accordance with the present invention.

FIG. 2 illustrates a further improved current source of high output impedance provided in a current steering cell 200, which can also be used to implement any of current steering cells 101-1 to 101-n in D/A converter 100 of FIG. 1. As shown in FIG. 2, current steering cell 200 includes a cascode current source 210 formed by PMOS transistors 201 and 202 and operational amplifier 203. Current steering cell 200 provides the load, represented by load resistor 207, the current of a differential input stage formed by PMOS transistors 204 and 205, which receive complementary input signals $d_i$ and $\sim d_i$ at their respective gate terminals 206a and 206b. In cascode current source 210, PMOS transistor 201 receives a bias voltage $V_{bias1}$. Operational amplifier 203, which receives the drain voltage of PMOS transistor 201 and a second bias voltage $V_{bias2}$, amplifies the on-resistance of PMOS transistor 202 by the gain of operational or differential amplifier 203. $V_{bias2}$ is set to operate PMOS transistor 202 in a saturation operating region, but also allows cascode PMOS transistor 202 to operate in a linear region as well. Consequently, PMOS transistor 202 may operate in a linear region and cascode current source 210 maintains a high output resistance, to allow an improved operating dynamic range of current steering cell 200. In fact, the output impedance of current steering cell 200 is given by:

$$Z_{out} = Z_{201} + A(Z_{202}(1 + Z_{205}G_{202}))$$

where A is the gain of differential amplifier 203, and $Z_{201}$, $Z_{202}$, $Z_{205}$ and $G_{202}$ are the impedances of transistors 201, 202, 205 and the conductance of transistor 202, respectively.

Since the gain A of differential amplifier 203 is very large, the output impedance of current steering cell 200 is much greater than the output impedance of current steering cell 150 of FIG. 1b. Further, when operating in the linear region, PMOS transistor 202 has a drain-to-source voltage ($V_{DS\text{-}linear}$) which is less than the corresponding drain-to-source voltage ($V_{DS\text{-}SAT}$) in the saturation operating region. Thus, current steering cell 200 can operate under even lower operating voltage conditions than current steering cell 150. The amplification of the on-resistance of cascode PMOS transistor 202 improves isolation of cascode current source 201 from switching noises in PMOS transistors 204 and 205.

The above detailed description is provided to illustrate the specific embodiments of the present invention and is not intended to be limiting. Numerous modifications and variations within the scope of the present invention are possible. The present invention is set forth in the following claims.

What is claimed is:

1. A digital-to-analog converter, comprising a plurality of current steering cells each steering, in response to a logic value of an input bit, a current of a predetermined magnitude onto a common terminal, each current steering cell comprising:

a first transistor having a control terminal, an input terminal, and an output terminal, said control terminal being coupled to receive a first bias voltage, said input terminal being coupled to receive a reference voltage;

a second transistor having a control terminal, an input terminal and an output terminal, said input terminal of said second transistor being coupled to said output terminal of said first transistor;

a differential amplifier having first and second input terminals and an output terminal, said first input terminal being coupled to said output terminal of said first transistor, said second input terminal coupled to receive a second bias voltage, and said output terminal of said differential amplifier being coupled to said control terminal of said second transistor, so as to allow said current of a predetermined magnitude to flow in said first and second transistors and such that said second transistor is biased to operate in a linear region; and a differential input stage receiving said input data bit and its complement for steering said current of a predetermined magnitude to said common terminal.

2. A current source as in claim 1, wherein said first and second transistors each comprise an MOS transistor.

3. A current steering cell comprising:

a first transistor having a control terminal coupled to receive a first bias voltage, an input terminal coupled to receive a reference voltage, and an output terminal;

a differential amplifier having a first input terminal coupled to the output terminal of the first transistor, a second input terminal coupled to receive a second bias voltage, and an output terminal;

a second transistor having a control terminal coupled to the output terminal of the differential amplifier, an input terminal coupled to the output terminal of the first transistor, and an output terminal, wherein the second bias voltage operates the second transistor in a linear region;

a third transistor having a control terminal coupled to receive an input signal, an input terminal coupled to the output terminal of the second transistor, and an output terminal coupled to a first steering cell output terminal; and a fourth transistor having a control terminal coupled to receive a complement of the input signal, an input terminal coupled to the output terminal of the second transistor, and an output terminal coupled to a second steering cell output terminal.

4. The steering cell of claim 3, wherein the first, second, third, and fourth transistors are PMOS transistors.

5. The steering cell of claim 3, further comprising a load resistor coupled between the first and second steering cell output terminals.

6. A current source, comprising:

a first transistor having a control terminal, an input terminal, and an output terminal, the control terminal being coupled to receive a first bias voltage, the input terminal being coupled to receive a reference voltage;

a second transistor having a control terminal, an input terminal and an output terminal, the input terminal of the second transistor being coupled to the output terminal of the first transistor; and a differential amplifier having first and second input terminals and an output terminal, the first input terminal being coupled to the output terminal of the first transistor, the second input terminal coupled to receive a second bias voltage, and the output terminal of the differential amplifier being coupled to the control terminal of the second transistor, so as to allow a current of predetermined magnitude to flow in the first and second transistors and such that the second transistor is biased to operate in a liner region.

7. The current source of claim 6, wherein the first and second transistors each comprise a MOS transistor.

* * * * *